(12) United States Patent
Irie

(10) Patent No.: US 6,984,472 B2
(45) Date of Patent: Jan. 10, 2006

(54) EXPOSURE METHOD AND APPARATUS

(75) Inventor: Shigeo Irie, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 496 days.

(21) Appl. No.: 09/891,213

(22) Filed: Jun. 26, 2001

(65) Prior Publication Data

US 2001/0055104 A1 Dec. 27, 2001

(30) Foreign Application Priority Data

Jun. 27, 2000 (JP) ............................. 2000-192455

(51) Int. Cl.
*G03F 9/00* (2006.01)
*H01L 21/00* (2006.01)

(52) U.S. Cl. .................. 430/5; 430/22; 430/30; 216/67

(58) Field of Classification Search ............ 430/5, 430/22, 30; 216/67
See application file for complete search history.

(56) References Cited

U.S. PATENT DOCUMENTS 5,466,942 A * 11/1995 Sakai et al. ............. 250/492.2
5,582,939 A * 12/1996 Pierrat ........................... 430/5
5,698,113 A * 12/1997 Baker et al. ................. 216/72
5,928,817 A * 7/1999 Yan et al. ...................... 430/5
6,031,598 A * 2/2000 Tichenor et al. ............ 355/67
6,279,249 B1 * 8/2001 Dao et al. ...................... 34/61
6,394,109 B1 * 5/2002 Somekh ....................... 134/39
6,449,332 B1   9/2002 Chiba

FOREIGN PATENT DOCUMENTS

| JP | 02-042713 A | 2/1990 |
| JP | 06-151281 A | 5/1994 |
| JP | 11-224839 | 8/1999 |
| JP | 2000-286187 A | 10/2000 |

OTHER PUBLICATIONS

Notice of Reasons of Rejection dated Mar. 23, 2004.

* cited by examiner

*Primary Examiner*—Mark F. Huff
*Assistant Examiner*—K. Sagar
(74) *Attorney, Agent, or Firm*—Nixon Peabody LLP; Donald R. Studebaker

(57) ABSTRACT

An unwanted deposited film is removed from the surface of a photomask in which a desired pattern has been formed. Then, a resist film is exposed to extreme ultraviolet radiation through the photomask, from which the deposited film has been removed, thereby transferring the desired pattern onto the resist film.

6 Claims, 7 Drawing Sheets

EXPOSURE METHOD AND APPARATUS

BACKGROUND OF THE INVENTION

The present invention relates to an exposure method and apparatus for exposing a resist film to extreme ultraviolet (EUV) radiation through a photomask.

As semiconductor devices for a semiconductor integrated circuit have been downsized, it has become increasingly necessary to further reduce the feature size of a line-and-space pattern. And to define a fine-line pattern, a lithography technique is indispensable. Particularly when a pattern with a line width of 0.07 µm or less should be defined, a lithography technique using EUV radiation with a wavelength of around 13 nm as an exposing radiation is expected to be very effective.

In a known lithographic process using krypton fluoride (KrF) excimer laser radiation (with a wavelength of around 248 nm) or argon fluoride (ArF) excimer laser radiation (with a wavelength of around 193 nm), an exposure process is carried out in the air or nitrogen ambient. However, if the same exposure process is performed in such an ambient using EUV radiation, then the radiation is absorbed into oxygen or nitrogen molecules contained in the ambient, because the EUV radiation has a much shorter wavelength. This is why the EUV exposure process should be carried out in a vacuum.

FIG. 6 schematically illustrates a cross-sectional structure for a known EUV exposure apparatus. As shown in FIG. 6, a substrate holder 2 is placed on the bottom of a vacuum chamber 1 to hold a semiconductor substrate 4, on which a resist film 3 has been formed, thereon. On the ceiling of the vacuum chamber 1, a mask holder 6 is placed to hold a reflective mask 5, in which a desired mask pattern has been defined, thereon.

An EUV radiation source 7 is disposed on the vacuum chamber 1. The EUV radiation emitted from the EUV radiation source 7 is reflected off from a reflective mirror 8 toward the reflective mask 5, reflected again by the reflective mask 5 and then passed through a reflection/demagnification optical system 9 to impinge onto the resist film 3. The image formed on the resist film 3 has had its size reduced to ⅕, for example. In this manner, the mask pattern defined in the reflective mask 5 is transferred onto the resist film 3.

FIG. 7 illustrates the flow of a known process for defining a resist pattern out of a chemically amplified resist material.

First, in Step SB1, a resist material is applied onto a semiconductor substrate to form a resist film thereon. Next, in Step SB2, the resist film is pre-baked to vaporize a solvent contained in the resist film.

Then, in Step SB3, the resist film is exposed to EUV radiation, thereby transferring the pattern of a reflective mask onto the resist film. Subsequently, in Step SB4, the resist film is post-baked so that the acid diffuses in the exposed or non-exposed parts of the resist film.

Finally, in Step SB5, the resist film is developed using an alkaline developer, thereby defining a resist pattern.

When a resist pattern should be formed out of a normal (or non-chemically-amplified) resist material, the resist film is exposed to EUV radiation and then developed immediately without being post-baked.

The present inventor carried out the known exposure process of transferring the mask pattern from the reflective mask (i.e., photomask) 5 onto the resist film 3 repeatedly. As a result, I found that the EUV radiation exposure dose of the resist film 3 decreased gradually, thus deteriorating the reproducibility or accuracy of the pattern actually formed.

SUMMARY OF THE INVENTION

An object of this invention is preventing the decrease in EUV radiation exposure dose of a resist film and thereby defining a desired pattern thereon with good reproducibility even if the process of transferring a mask pattern from a photomask onto the resist film is performed repeatedly.

I carried out intensive research to know why the exposure dose of a resist film decreased if the resist film was exposed to the EUV radiation many times. As a result, I found that as a photomask was used for the EUV radiation exposure process repeatedly, the mask was contaminated gradually to decrease the exposure dose of the resist film.

So I carried out further research to find how the surface of the mask was contaminated through the repetition of the EUV radiation exposure process. The following is my findings. Specifically, in an exposure process using the EUV radiation, a photomask is irradiated with the EUV radiation in a vacuum at a high energy of about 100 eV. Accordingly, reactants including $Co_x$ (where x<2), produced while a gas (e.g., $CO_2$ gas) is vaporized from the resist film, deposit themselves on the surface of the photomask. Or carbon compounds, existing in very small amounts inside the vacuum chamber, turn into carbides through the exposure to the high-energy EUV radiation and then those carbides deposit themselves on the surface of the photomask. As a result, a carbon-containing film is deposited unexpectedly on the surface of the photomask, thus decreasing the amount of radiation reaching the resist film by way of the photomask.

I acquired the basic idea of this invention from these findings.

Specifically, a first inventive exposure method includes the steps of: a) removing an unwanted deposited film from the surface of a photomask, in which a desired pattern has been formed; and b) exposing a resist film to extreme ultraviolet radiation through the photomask, from which the deposited film has been removed, thereby transferring the desired pattern onto the resist film.

In the first exposure method, an unwanted deposited film is removed from the surface of a photomask, and then a resist film is exposed to extreme ultraviolet radiation through the photomask. Accordingly, the exposure dose of the resist film, i.e., the amount of extreme ultraviolet radiation reaching the resist film by way of the photomask, does not decrease and a desired pattern can be transferred onto the resist film with good reproducibility.

In one embodiment of the present invention, the step a) preferably includes removing the deposited film using oxygen plasma.

Then, the deposited film can be removed from the surface of the photomask efficiently with the oxygen plasma, because the deposited film essentially consists of $CO_x$ (where x<2) reactants.

A second inventive exposure method includes the steps of: a) loading a substrate, on which a resist film has been formed, into a vacuum chamber; b) removing an unwanted deposited film from the surface of a photomask having a desired pattern therein inside the vacuum chamber by using oxygen plasma that has been generated in the chamber; and c) exposing the resist film to extreme ultraviolet radiation through the photomask, from which the deposited film has been removed, thereby transferring the desired pattern onto the resist film.

In the second exposure method, a deposited film is removed from the surface of a photomask with oxygen plasma and then a resist film is exposed to extreme ultraviolet radiation through the photomask. Accordingly, the exposure dose of the resist film, i.e., the amount of extreme ultraviolet radiation reaching the resist film by way of the photomask, does not decrease and a desired pattern can be transferred onto the resist film with good reproducibility.

A third inventive exposure method includes the steps of: a) removing an unwanted deposited film from the surface of a photomask having a desired pattern therein inside a first vacuum chamber by using oxygen plasma that has been generated in the first vacuum chamber; b) loading a substrate, on which a resist film has been formed, into a second vacuum chamber; c) transporting the photomask, from which the deposited film has been removed, in line from inside the first vacuum chamber to inside the second vacuum chamber; and d) exposing the resist film to extreme ultraviolet radiation through the photomask inside the second vacuum chamber, thereby transferring the desired pattern onto the resist film.

In the third exposure method, a deposited film is removed from the surface of a photomask with oxygen plasma and then a resist film is exposed to extreme ultraviolet radiation through the photomask. Accordingly, the exposure dose of the resist film, i.e., the amount of extreme ultraviolet radiation reaching the resist film by way of the photomask, does not decrease and a desired pattern can be transferred onto the resist film with good reproducibility. In addition, the step a) of removing the deposited film from the surface of the photomask with oxygen plasma and the step d) of exposing the resist film to extreme ultraviolet radiation through the photomask are performed in mutually different chambers. Accordingly, once removed from the photomask, the deposited film will never deposit itself onto the photomask or other optical members.

A first inventive exposure apparatus includes vacuum chamber, substrate holder, optical system, gas introducing means and plasma generating means. The substrate holder is placed inside the vacuum chamber to hold a substrate, on which a resist film has been formed, thereon. The optical system is disposed inside the vacuum chamber and used for exposing the resist film to extreme ultraviolet radiation through a photomask, in which a desired pattern has been formed, and thereby transferring the pattern from the photomask onto the resist film. The gas introducing means is provided to introduce oxygen gas into the vacuum chamber. And the plasma generating means is used for generating a plasma out of the oxygen gas that has been introduced into the vacuum chamber.

The first exposure apparatus includes means for introducing oxygen gas into a vacuum chamber and means for generating a plasma out of the oxygen gas introduced into the vacuum chamber. Accordingly, the first apparatus can expose a resist film to extreme ultraviolet radiation through a photomask after having removed a deposited film from the surface of the photomask with oxygen plasma. Thus, the exposure dose of the resist film, i.e., the amount of extreme ultraviolet radiation reaching the resist film by way of the photomask, does not decrease and a desired pattern can be transferred onto the resist film with good reproducibility.

A second inventive exposure apparatus includes first and second vacuum chambers, gas introducing means, plasma generating means, substrate holder, optical system and transporting means. The gas introducing means is provided to introduce oxygen gas into the first vacuum chamber. The plasma generating means is used for generating a plasma out of the oxygen gas that has been introduced into the first vacuum chamber. The substrate holder is placed inside the second vacuum chamber to hold a substrate, on which a resist film has been formed, thereon. The optical system is also disposed inside the second vacuum chamber and used for exposing the resist film to extreme ultraviolet radiation through a photomask, in which a desired pattern has been formed, and thereby transferring the pattern from the photomask onto the resist film. And the transporting means is used for transporting the photomask associated with the optical system in line from inside the first chamber to inside the second chamber or vice versa.

The second apparatus can expose a resist film to extreme ultraviolet radiation through a photomask after having removed a deposited film from the surface of the photomask with oxygen plasma. Accordingly, the exposure dose of the resist film, i.e., the amount of extreme ultraviolet radiation reaching the resist film by way of the photomask, does not decrease and a desired pattern can be transferred onto the resist film with good reproducibility. In addition, a chamber in which the deposited film is removed from the surface of the photomask with oxygen plasma and a chamber in which the resist film is exposed to extreme ultraviolet radiation through the photomask are different ones. Accordingly, once removed from the photomask, the deposited film will never deposit itself onto the photomask or other optical members.

DESCRIPTION OF THE PREFERRED EMBODIMENTS

Embodiment 1

Figure 1:
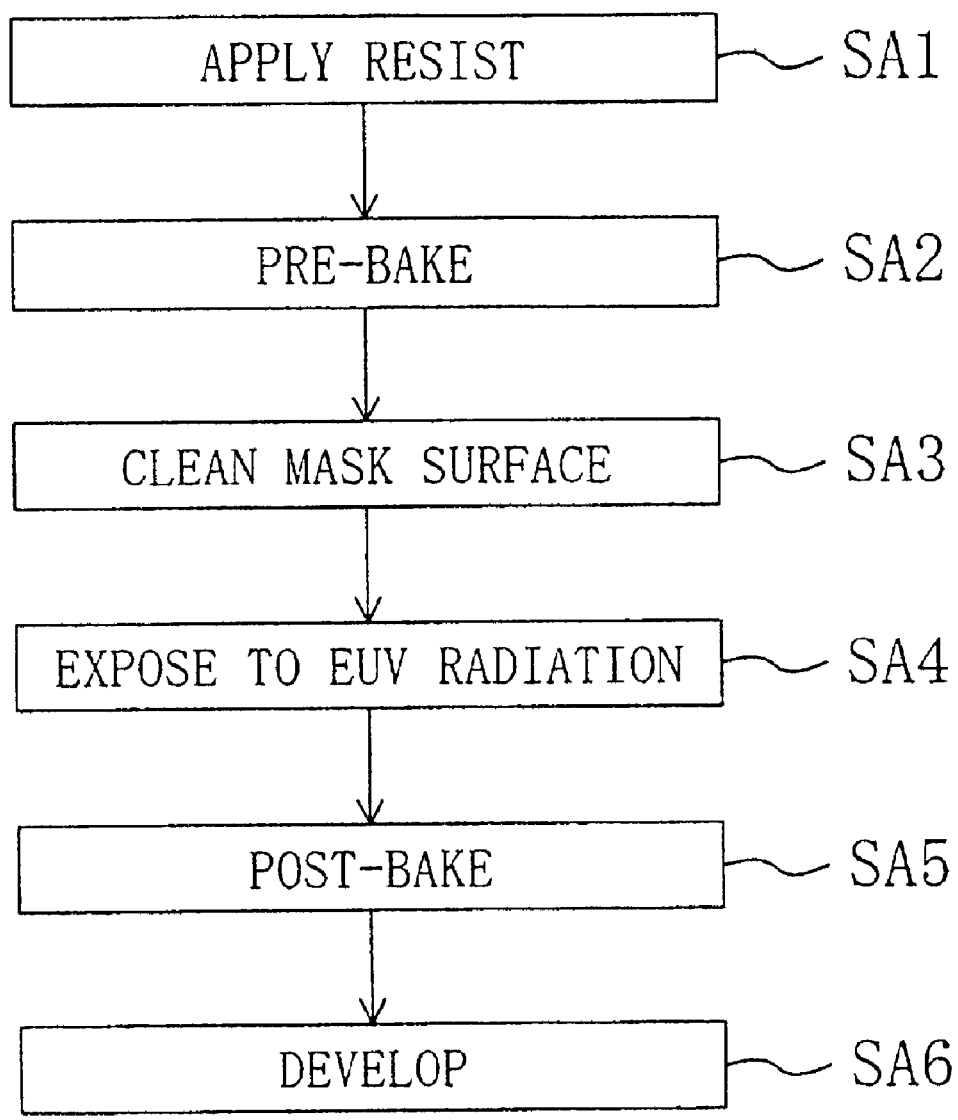
FIG. 1 is a flowchart illustrating an exposure method according to a first embodiment of the present invention.

Hereinafter, an exposure method according to a first embodiment of the present invention will be described with reference to FIG. 1.

First, in Step SA1, a chemically amplified resist material is applied onto a semiconductor substrate to form a resist film thereon. Next, in Step SA2, the resist film is pre-baked to vaporize a solvent contained in the resist film.

Then, in Step SA3, a reflective mask for use in an exposure process has its surface cleaned with oxygen plasma, thereby removing an unwanted deposited film from the surface of the reflective mask. The reflective mask may be of any type. For example, the reflective mask may include a mask pattern that is formed on an EUV radiation reflective film. The mask pattern may be made of tantalum, which absorbs EUV radiation, while the EUV radiation reflective film may be a stack of molybdenum and silicon films.

Subsequently, in Step SA4, the resist film is exposed to EUV radiation with a wavelength of around 13 nm, thereby transferring the mask pattern from the reflective mask onto the resist film. Thereafter, in Step SA5, the resist film is post-baked so that the acid diffuses in the exposed or non-exposed parts of the resist film.

Finally, in Step SA6, the resist film is developed using an alkaline developer, thereby defining a resist pattern.

In the first embodiment, an unwanted deposited film is removed from the surface of a reflective mask by cleaning the surface of the reflective mask with oxygen plasma and then a resist film is exposed to EUV radiation. Accordingly, the exposure dose of the resist film, i.e., the amount of EUV radiation reaching the resist film by way of the photomask, does not decrease and a desired pattern can be transferred onto the resist film with good reproducibility.

It should be noted that not just the reflective mask, but also other optical members (e.g., reflective mirror or demagnification optical system) existing inside the chamber of the exposure apparatus are preferably cleaned simultaneously with oxygen plasma. Then, the exposure dose of the resist film much less likely decreases at the optical system. Accordingly, any resist pattern can be defined with even better reproducibility.

Also, the process step of cleaning the surface of the reflective mask with oxygen plasma is preferably performed every time the EUV exposure process is carried out. However, if the carbidation of carbon compounds, existing in very small amounts inside the chamber, is suppressible sufficiently by increasing the vacuum inside the chamber, the oxygen plasma cleaning does not have to be performed on the surface of the reflective mask every time the exposure process is carried out. In that case, the cleaning may be performed once after the exposure process has been carried out several times.

Also, the EUV radiation does not have to have a wavelength of around 13 nm, but may have a wavelength of about 3 to about 50 nm if necessary.

Where a resist pattern should be formed out of a non-chemically-amplified resist material, the resist film is also pre-baked first. Next, the reflective mask for use in the exposure process has its surface cleaned with oxygen plasma. Subsequently, the resist film is exposed to EUV radiation and then developed immediately without being post-baked, thereby defining a resist pattern.

Embodiment 2

Hereinafter, an exposure apparatus for use to implement the exposure method of the first embodiment will be described as a second embodiment of the present invention with reference to FIG. 2.

Figure 2:
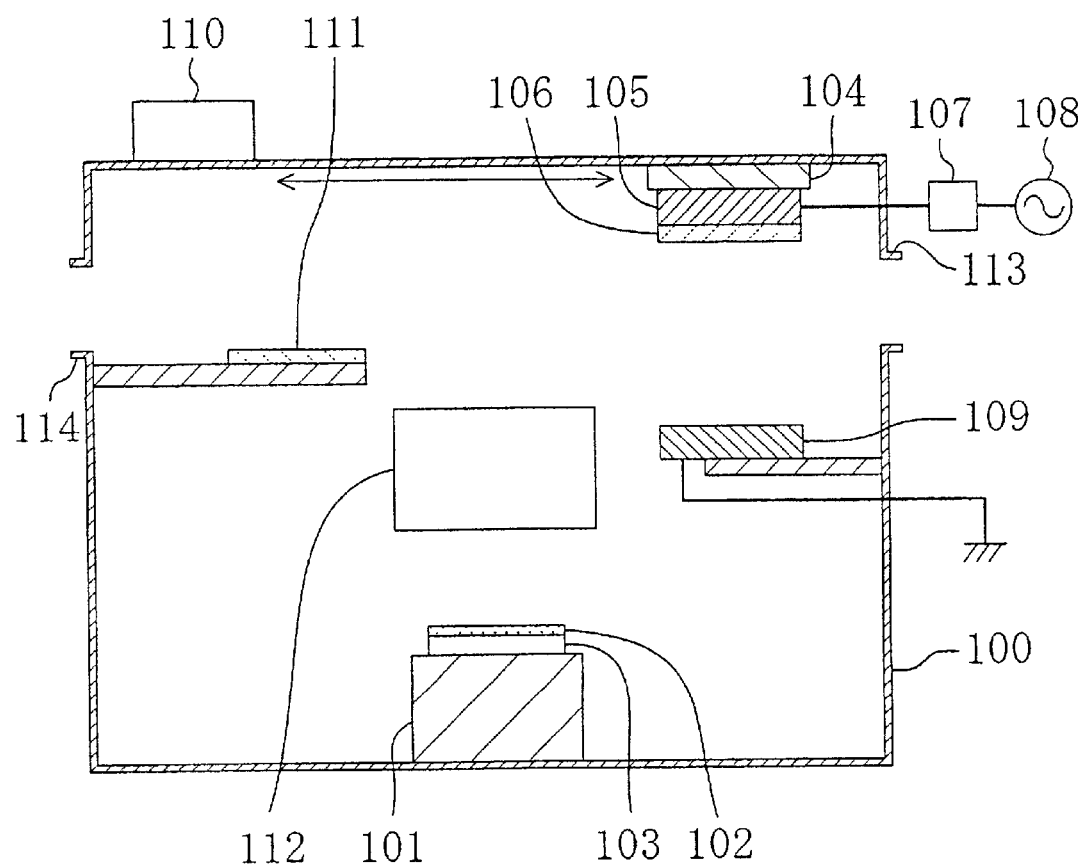
FIG. 2 is a schematic cross-sectional view illustrating an exposure apparatus according to a second embodiment of the present invention.

As shown in FIG. 2, a substrate holder 101 is placed on the bottom of a vacuum chamber 100 to hold a semiconductor substrate 103, on which a resist film 102 has been formed, thereon.

On the ceiling of the vacuum chamber 100, a mask holder 104, which is movable horizontally (i.e., to the right or left in FIG. 2) inside the vacuum chamber 100, is disposed. The mask holder 104 holds a reflective mask 106 with an RF electrode 105 interposed therebetween. An RF power supply 108 is connected to the RF electrode 105 by way of a matching circuit 107.

When the mask holder 104 is located on the right-hand side of FIG. 2 after having moved rightward inside the vacuum chamber 100, the RF electrode 105 secured to the mask holder 104 faces a grounded, counter electrode 109. Accordingly, if RF power is applied from the RF power supply 108 to the RF electrode 105 while the RF and counter electrodes 105 and 109 are facing each other, a plasma is generated between the RF and counter electrodes 105 and 109.

As in the known apparatus, an EUV radiation source 110 is placed on the vacuum chamber 100. A reflective mirror 111 for reflecting the EUV radiation, emitted from the EUV radiation source 110, toward the reflective mask 106 is also provided inside the vacuum chamber 100. A reflection/demagnification optical system 112 for condensing the EUV radiation, which has been reflected off from the reflective mask 106, to about ⅕, for example, and then making the condensed ray incident onto the resist film 102 on the semiconductor substrate 103, is also provided inside the vacuum chamber 100. The reflection/demagnification optical system 112 may be made up of several reflective mirrors, each having a stack of molybdenum and silicon films as its reflective surface.

The vacuum chamber 100 further includes a gas inlet port 113 for introducing oxygen gas into the chamber 100 and a gas outlet port 114 for exhausting a reactant gas.

In the second embodiment, a parallel plate plasma processor, including the RF and counter electrodes 105 and 109, is used. Alternatively, the plasma may also be generated using an apparatus of any other type.

Hereinafter, it will be described with reference to FIGS. 2 through 4 how to perform an exposure process using the apparatus of the second embodiment.

First, as shown in FIG. 2, the semiconductor substrate 103, on which the resist film 102 has been formed, is placed on the substrate holder 101. Then, the mask holder 104 is moved to the right in FIG. 2 inside the vacuum chamber 100 so that the RF electrode 105, secured to the mask holder 104, faces the counter electrode 109.

Figure 3:
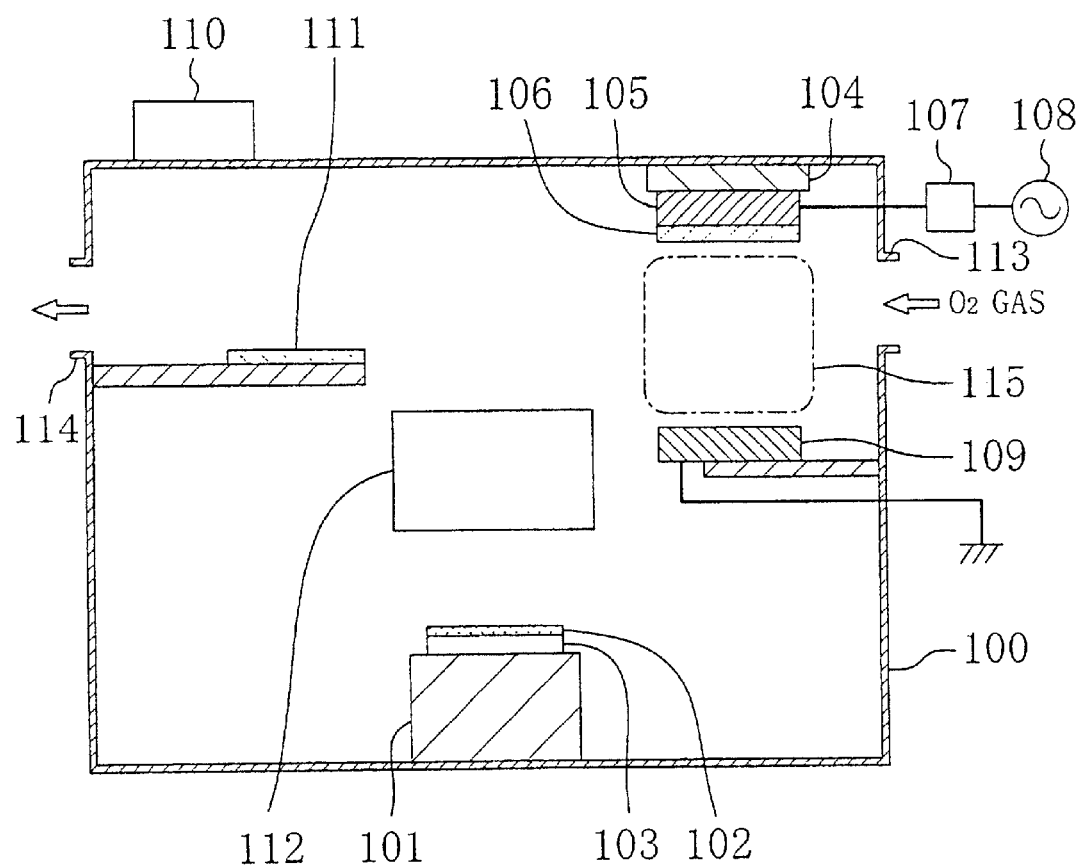
FIG. 3 is a schematic cross-sectional view illustrating an exposure method according to the second embodiment.

Next, as shown in FIG. 3, oxygen gas is introduced through the gas inlet port 113 into the vacuum chamber 100 so as to create a vacuum of about 25 to about 30 Pa and RF power is applied from the RF power supply 108 to the RF electrode 105. Then, oxygen plasma 115 is generated between the RF and counter electrodes 105 and 109. As a result, the unwanted deposited film is removed from the surface of the reflective mask 106 with the oxygen plasma and the reflective mask 106 can have its surface cleaned. It should be noted that the reactants like $CO_2$, resulting from the reaction between the deposited film and oxygen plasma, are exhausted through the gas outlet port 114.

Figure 4:
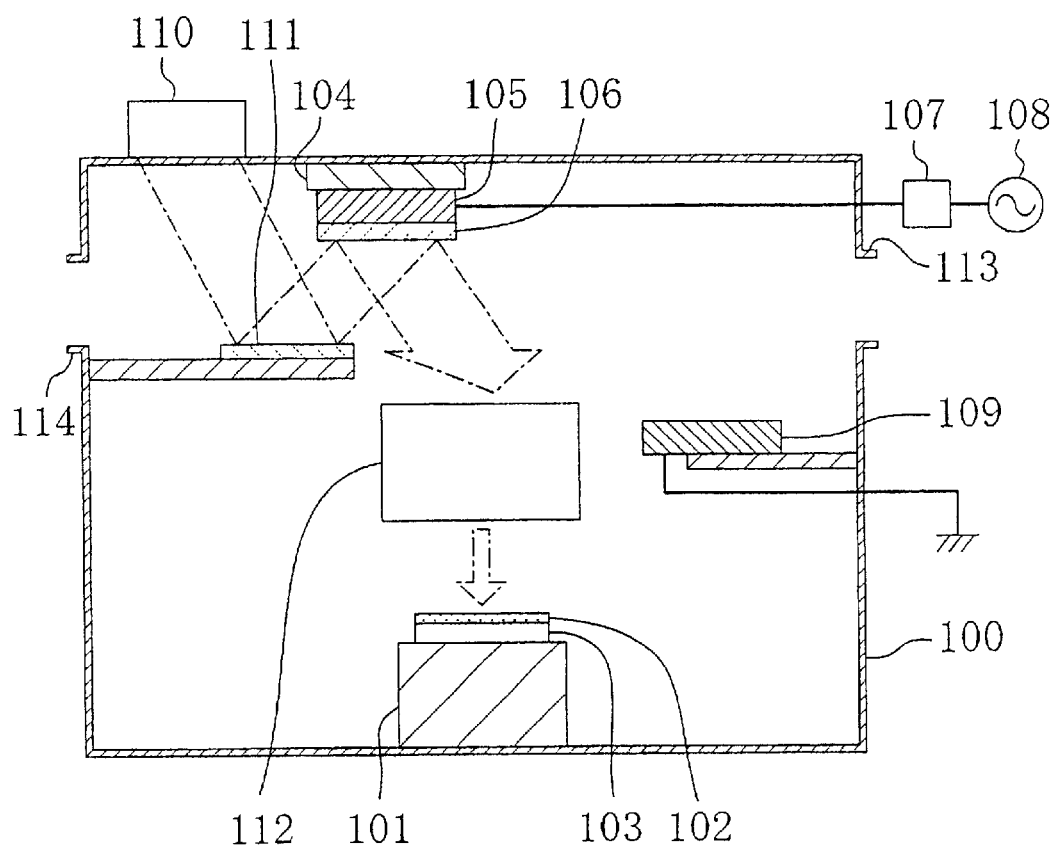
FIG. 4 is a schematic cross-sectional view illustrating the exposure method of the second embodiment.

Subsequently, as shown in FIG. 4, the mask holder 104 is moved to the left in FIG. 4 inside the vacuum chamber 100 so that the reflective mask 106 held by the mask holder 104 is located between the reflective mirror 111 and reflection/demagnification optical system 112. Thereafter, the EUV radiation source 110 is allowed to emit the EUV radiation. Then, the EUV radiation is reflected off from the reflective mirror 111 toward the reflective mask 106 and then reflected again by the reflective mask 106. Accordingly, a patterned EUV ray goes out of the reflective mask 106. Subsequently, the patterned EUV ray is passed through, and condensed to about ⅕ by, the reflection/demagnification optical system 112. And then the condensed ray is incident onto the resist film 102. In this manner, the pattern of the reflective mask 106 is transferred onto the resist film 102.

In the second embodiment, the deposited film is removed from the surface of the reflective mask 106 by cleaning the surface of the reflective mask 106 with oxygen plasma and then the resist film 102 is exposed to EUV radiation. Accordingly, the exposure dose of the resist film 102, i.e., the amount of EUV radiation reaching the resist film 102, does not decrease and a desired pattern can be transferred onto the resist film 102 with good reproducibility.

Embodiment 3

Hereinafter, an exposure apparatus for use to implement another inventive exposure method will be described as a third embodiment of the present invention with reference to FIG. 5.

Figure 5:
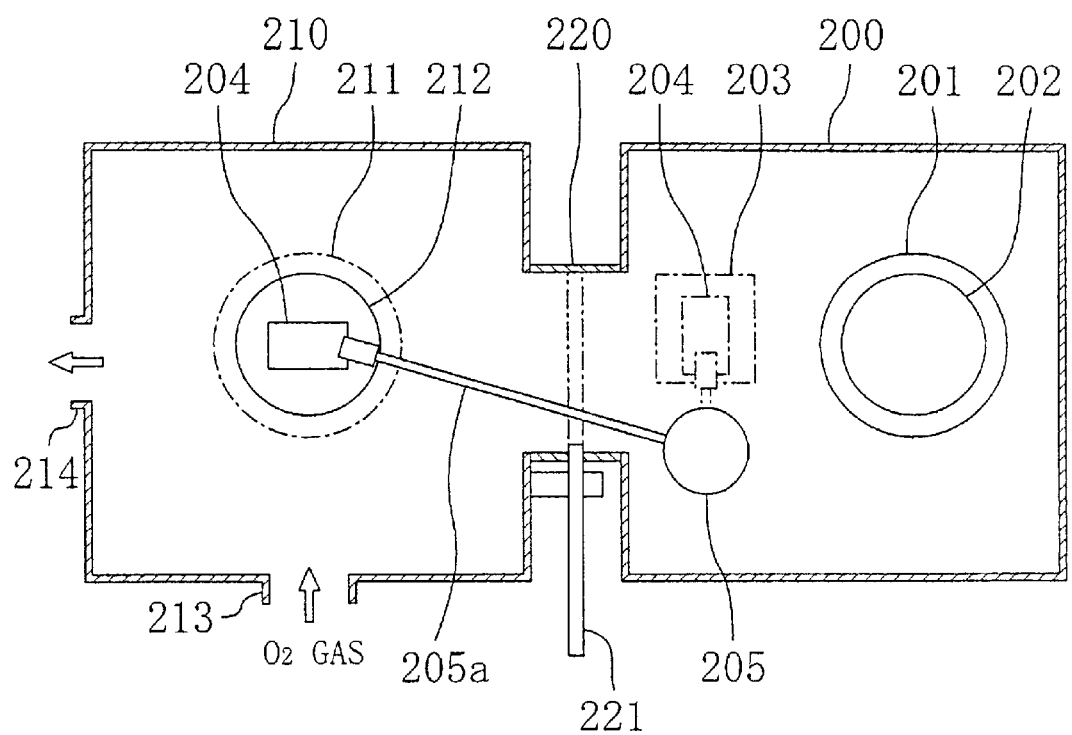
FIG. 5 is a schematic plan view illustrating an exposure apparatus according to a third embodiment of the present invention.
Figure 6:
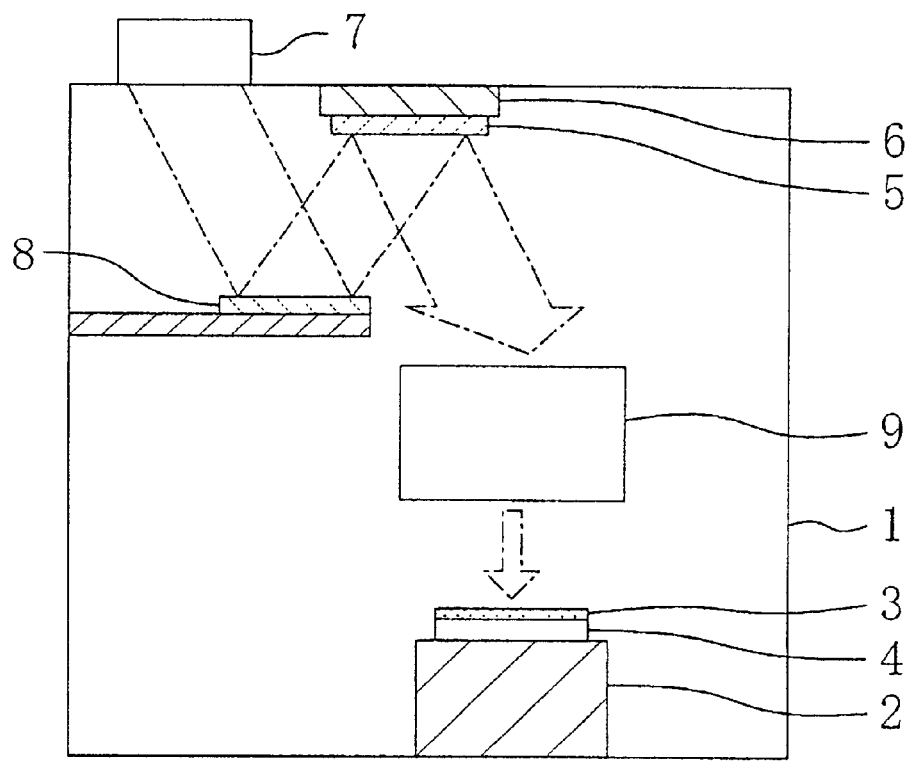
FIG. 6 is a schematic cross-sectional view illustrating a known exposure apparatus.
Figure 7:
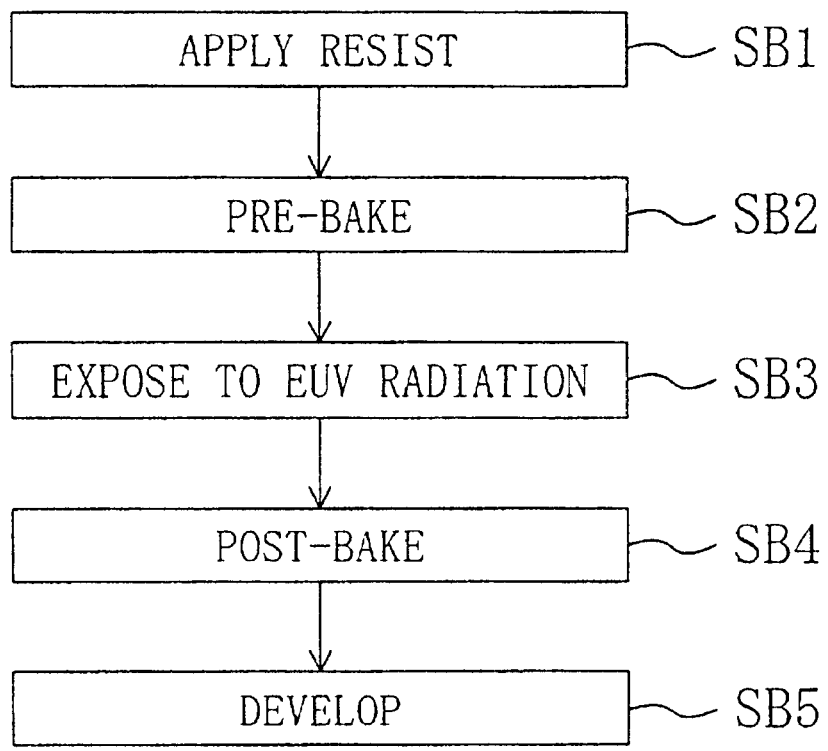
FIG. 7 is a flowchart illustrating a known exposure process.

As shown in FIG. 5, the exposure apparatus includes exposure chamber 200, plasma processing chamber 210 and communication chamber 220 for making the exposure and plasma processing chambers 200 and 210 communicate with each other. A vacuum is created and maintained in both of the exposure and plasma processing chambers 200 and 210.

As also shown in FIG. 5, a substrate holder 201 is placed on the bottom of the exposure chamber 200 to hold a semiconductor substrate 202, on which a resist film has been formed, thereon. On the ceiling of the exposure chamber 200, a mask holder 203 is disposed. The mask holder 203 can hold a reflective mask 204 in a removable state.

Although not shown in FIG. 5, an EUV radiation source is placed on the exposure chamber 200. A reflective mirror (not shown) for reflecting the EUV radiation, emitted from the EUV radiation source, toward the reflective mask 204 is also provided inside the exposure chamber 200. A reflection/demagnification optical system (not shown) for condensing the EUV radiation, which has been reflected off from the reflective mask 204, to about 1/5, for example, and then making the condensed ray incident onto the resist film on the semiconductor substrate 202, is also provided inside the exposure chamber 200.

An RF electrode 211 is disposed on the ceiling of the plasma processing chamber 210 and is connected to an RF power supply (not shown) by way of a matching circuit (not shown). On the bottom of the plasma processing chamber 210, a counter electrode 212 is disposed so as to face the RF electrode 211 and is grounded. Also, the counter electrode 212 can hold the reflective mask 204 in a removable state. When RF power is applied to the RF electrode 211, a plasma is generated between the RF and counter electrodes 211 and 212. The plasma processing chamber 210 further includes gas inlet and outlet ports 213 and 214 for introducing oxygen gas into the chamber 210 and for exhausting a reactant gas, respectively.

Also, a handling robot 205 is placed inside the exposure chamber 200. The robot 205 includes an arm 205a for holding the reflective mask 204 thereon and a driving means. The driving means extends or contracts the arm 205a, rotates the arm 205a around its axis or moves the arm 205a horizontally in a circle. And the robot 205 can transport the reflective mask 204 from the counter electrode 212 to the mask holder 203, or vice versa.

The communication chamber 220 is provided with a shutter 221. By opening or closing the shutter 221 inside the communication chamber 220 using the driving means, the exposure and plasma processing chambers 200 and 210 can selectively communicate or be shut off with/from each other.

Hereinafter, it will be described how to perform an exposure process using the exposure apparatus of the third embodiment.

First, the handling robot 205 is driven to move the reflective mask 204, which is now held by the arm 205a of the robot 205, to the counter electrode 212 and place the mask 204 on the electrode 212. Then, the shutter 221 is closed to shut off the exposure and plasma processing chambers 200 and 210 from each other.

Next, oxygen gas is introduced through the gas inlet port 213 into the plasma processing chamber 210 so as to create a vacuum of about 25 to about 30 Pa. Also, RF power is applied to the RF electrode 211 to generate oxygen plasma between the RF and counter electrodes 211 and 212. As a result, the unwanted deposited film is removed from the surface of the reflective mask 204 with the oxygen plasma and the reflective mask 204 can have its surface cleaned.

Thereafter, the shutter 221 is opened so that the exposure and plasma processing chambers 200 and 210 communicate with each other. Then, the handling robot 205 is driven to transport the reflective mask 204, which is now placed on the counter electrode 212, to the mask holder 203.

Subsequently, the shutter 221 is closed to shut off the exposure and plasma processing chambers 200 and 210 from each other. In such a state, the EUV radiation source is allowed to emit the EUV radiation. Then, the EUV radiation is reflected off from the reflective mirror toward the reflective mask 204 and then reflected again by the reflective mask 204. Accordingly, a patterned EUV ray goes out of the reflective mask 204. Subsequently, the patterned EUV ray is passed through, and condensed to about 1/5 by, the reflection/demagnification optical system. And the condensed ray is incident onto the resist film on the semiconductor substrate 202. In this manner, the pattern of the reflective mask 204 is transferred onto the resist film.

In the third embodiment, the deposited film is removed from the surface of the reflective mask 204 by cleaning the surface of the reflective mask 204 with oxygen plasma and then the resist film is exposed to EUV radiation. Accordingly, the exposure does of the resist film, or the amount of the EUV radiation reaching the resist film, does not decrease and a desired pattern can be transferred onto the resist film with good reproducibility.

In addition, the cleaning process step of removing the deposited film from the surface of the reflective mask 204 is performed inside the plasma processing chamber 210. On the other hand, the EUV exposure process step is performed inside the exposure chamber 200 that is shut off from the plasma processing chamber 210. Accordingly, neither the reflective mirror nor the optical system including the reflection/demagnification optical system is contaminated with the deposited film that has been once removed from the surface of the reflective mask 204.

In the third embodiment, a parallel plate plasma processor, including the RF and counter electrodes 211 and 212, is used. Alternatively, the plasma may also be generated by an apparatus of any other type.

What is claimed is:

1. An exposure method comprising the steps of:
   a) removing an unwanted deposited film from a surface of a photomask in a first region inside a vacuum chamber; and
   b) exposing a resist film to extreme ultraviolet radiation through the photomask, from which the deposited film has been removed in a second region, which is different from the first region, inside the vacuum chamber.

2. The method of claim 1, wherein the step a) comprises removing the deposited film using oxygen plasma.

3. An exposure method comprising the steps of:
   a) loading a substrate, on which a resist film has been formed, into a vacuum chamber;
   b) removing an unwanted deposited film from the surface of a photomask in a first region inside the vacuum chamber; and
   c) in a second region, which is different from the first region, inside the vacuum chamber, exposing the resist film to extreme ultraviolet radiation through the photomask, from which the deposited film has been removed.

4. An exposure method comprising the steps of:
   a) removing an unwanted deposited film from a surface of a photomask having a desired pattern therein inside a first vacuum chamber by using oxygen plasma that has been generated in the first vacuum chamber;
   b) loading a substrate, on which a resist film has been formed, into a second vacuum chamber;

c) transporting the photomask, from which the deposited film has been removed, in line from inside the first vacuum chamber to inside the second vacuum chamber; and d) exposing the resist film to extreme ultraviolet radiation through the photomask inside the second vacuum chamber, thereby transferring the desired pattern onto the resist film.

5. The method of claim 3, wherein the step of exposing the resist film to extreme ultraviolet radiation is performed after the photomask is moved from the first region.

6. The method of claim 1, wherein the first region has a plasma gas inlet.

* * * * *